(12) United States Patent
Yang et al.

(10) Patent No.: US 7,498,556 B2
(45) Date of Patent: Mar. 3, 2009

(54) IMAGE SENSOR MODULE HAVING BUILD-IN PACKAGE CAVITY AND THE METHOD OF THE SAME

(75) Inventors: Wen-Kun Yang, Hsin-Chu (TW); Diann-Fang Lin, Hukou Township, Hsinchu County (TW); Jui-Hsien Chang, Jhudong Township, Hsinchu County (TW); Tung-Chuan Wang, Yangmei Town (TW)

(73) Assignee: Adavanced Chip Engineering Technology Inc. (TW)

( * ) Notice: Subject to any disclaimer, the term of this patent is extended or adjusted under 35 U.S.C. 154(b) by 0 days.

(21) Appl. No.: 11/725,041

(22) Filed: Mar. 15, 2007

(65) Prior Publication Data

US 2008/0224248 A1 Sep. 18, 2008

(51) Int. Cl.
*H01L 27/00* (2006.01)
(52) U.S. Cl. ............... 250/208.1; 250/239; 257/698
(58) Field of Classification Search ............... 250/239, 250/208.1; 257/698
See application file for complete search history.

(56) References Cited

U.S. PATENT DOCUMENTS

2005/0121770 A1* 6/2005 Baek et al. ............... 257/698
2007/0045515 A1* 3/2007 Farnworth et al. ....... 250/208.1

* cited by examiner

*Primary Examiner*—Seung C Sohn
(74) *Attorney, Agent, or Firm*—Abelman, Frayne & Schwab

(57) ABSTRACT

The present invention provides an image sensor module having build-in package cavity and the Method of the same. An image sensor module structure comprising a substrate with a package receiving cavity formed within an upper surface of the substrate and conductive traces within the substrate, and a package having a die with a micro lens disposed within the package receiving cavity. A dielectric layer is formed on the package and the substrate, a re-distribution conductive layer (RDL) is formed on the dielectric layer, wherein the RDL is coupled to the die and the conductive traces and the dielectric layer has an opening to expose the micro lens. A lens holder is attached on the substrate and the lens holder has a lens attached an upper portion of the lens holder. A filter is attached between the lens and the micro lens. The structure further comprises a passive device on the upper surface of the substrate within the lens holder.

15 Claims, 5 Drawing Sheets

IMAGE SENSOR MODULE HAVING BUILD-IN PACKAGE CAVITY AND THE METHOD OF THE SAME

FIELD OF THE INVENTION

This invention relates to a structure of image sensor, and more particularly to an image sensor module having build-in package cavity and the method of the same.

DESCRIPTION OF THE PRIOR ART

Digital video cameras are under development to facilitate as home appliances. Due to the quick development of the semiconductor technology, the application of the image sensor is widely used for digital still camera or movie camera. Consumers' demand has been directed to light weight, multifunction and high resolution. To meet such demand, technical levels of manufacturing camera have been improved. CCD or CMOS chip is popular device for these camera to capture image and die-bonded by means of a conductive adhesive. Typically, an electrode pad of the CCD or CMOS is wire-bonded by means of a metal wire. The wire bonding limits the size of the sensor module. The device is formed by traditional resin packaging method.

A commonly used conventional image sensor device has an array of photodiodes formed on the surface of the wafer substrate. The methods of forming such photo arrays are well known to those having ordinary skill in the art. Typically, the wafer substrate is mounted to a flat support structure and electrically connected to a plurality of electrical contacts. The substrate is electrically connected to bond pads of the support structure using wires. The structure is then enclosed in a package with a light transmissive surface that allows light to impinge on the array of photodiodes. In order to produce a flat image with relatively little distortion or little chromatic aberration requires the implementation of multiple lenses which are arranged to generate a flat optical plane. This can require many expensive optical elements.

Further, in the field of semiconductor devices, the device density is increased and the device dimension is reduced, continuously. The demand for the packaging or interconnecting techniques in such high density devices is also increased to fit the situation mentioned above.

Conventionally, in the flip-chip attachment method, an array of solder bumps is formed on the surface of the die. The formation of the solder bumps may be carried out by using a solder composite material through a solder mask for producing a desired pattern of solder bumps. The function of chip package includes power distribution, signal distribution, heat dissipation, protection and support . . . and so on. As a semiconductor become more complicated, the traditional package technique, for example lead frame package, flex package, rigid package technique, can't meet the demand of producing smaller chip with high density elements on the chip. Because conventional package technologies have to divide a dice on a wafer into respective dies and then package the die respectively, therefore, these techniques are time consuming for manufacturing process. Since the chip package technique is highly influenced by the development of integrated circuits, therefore, as the size of electronics has become demanding, so does the package technique. For the reasons mentioned above, the trend of package technique is toward ball grid array (BGA), flip chip (FC-BGA), chip scale package (CSP), Wafer level package (WLP) today. "Wafer level package" is to be understood as meaning that the entire packaging and all the interconnections on the wafer as well as other processing steps are carried out before the singulation (dicing) into chips (dies). Generally, after completion of all assembling processes or packaging processes, individual semiconductor packages are separated from a wafer having a plurality of semiconductor dies. The wafer level package has extremely small dimensions combined with extremely good electrical properties.

WLP technique is an advanced packaging technology, by which the die are manufactured and tested on the wafer, and then singulated by dicing for assembly in a surface-mount line. Because the wafer level package technique utilizes the whole wafer as one object, not utilizing a single chip or die, therefore, before performing a scribing process, packaging and testing has been accomplished; furthermore, WLP is such an advanced technique so that the process of wire bonding, die mount and under-fill can be omitted. By utilizing WLP technique, the cost and manufacturing time can be reduced, and the resulting structure of WLP can be equal to the die; therefore, this technique can meet the demands of miniaturization of electronic devices.

Therefore, the present invention provides an image sensor module to reduce the package size and cost.

SUMMARY OF THE INVENTION

The object of the present invention is to provide an image sensor module to link to MB without "connector" for BGA/LGA type.

The object of the present invention is to provide an image sensor module with PCB having cavities for super thin module application and small foot print (form factor), simple process for CIS module.

The further object of the present invention is to provide an image sensor module which is re-workable by de-soldering.

The present invention provides a method for forming an image sensor module package comprising: providing a substrate with a package receiving cavity formed within an upper surface of the substrate and a conductive trace formed therein, wherein the substrate having contact metal formed thereon; picking and attaching a package into the cavity; wherein the package including a die with micro lens area attached on the base of the package, and filling a first material surrounding the die and keeping the same level with die; cleaning die surface and pads; forming a dielectric layer over the base and die, then to open the I/O pads and micro lens area of the die; forming a RDL on the die and the base to form the fan-out structure; Next, attaching a stencil printing solder paste on the substrate; picking and placing passive components on the substrate by picking and placing tool; soldering the passive components on the substrate by an IR reflow; also forming a solder bridge (bump) on the RDL and the substrate to couple with the trace and the die through the contact metal; and mounting a lens holder on the substrate.

The present invention also provides an image sensor module structure comprising: a substrate with a package receiving cavity formed within an upper surface of the substrate and conductive traces within the substrate, wherein the substrate having a contact metal formed thereon; a package having a die with a micro lens placed on the base of the package; a first material fill into the surrounding of die and keeping the same plane with die; a dielectric layer formed on the die and the base, wherein the dielectric layer has an opening to expose the micro lens; a re-distribution conductive layer (RDL) formed on the dielectric layer, wherein the first RDL is coupled to the die and the conductive traces; a protection dielectric layer formed over the RDL, and having an opening to expose the micro lens; a solder bridge (bump) formed on the protection dielectric layer and the substrate to communicate with the trace through the contact metal; a lens holder attached on the substrate, the lens holder having a lens attached an upper portion of the lens holder.

It should be noted that an opening is formed within the dielectric layer and a top protection layer to expose the micro lens area of the die for CMOS Image Sensor (CIS). A transparent cover with coating IR filter is optionally formed over the micron lens area for protection.

The image sensor chips has been coated the protection layer (film) on the micro lens area; the protection layer (film) with the properties of water repellent and oil repellent that can away the particle contamination on the micro lens area; the thickness of protection layer (film) preferably around 0.1 um to 0.3 um and the reflection index close to air reflection index 1. The process can be executed by SOG (spin on glass) skill and it can be processed either in silicon wafer form or panel wafer form (preferably in silicon wafer form to avoid the particle contamination during further process). The materials of protection layer can be $SiO_2$, $Al_2O_3$ or Fluoro-polymer etc.

The dielectric layer includes an elastic dielectric layer, silicone dielectric based material, BCB or PI. The silicone dielectric based material comprises siloxane polymers (SINR), Dow Corning WL5000 series. Alternatively, the dielectric layer comprises a photosensitive layer. The RDL communicates to the terminal pads downwardly the contacting via through holes structure.

The material of the substrate includes organic epoxy type FR4, FR5, BT, PCB (print circuit board), alloy or metal. Alternatively, the substrate could be glass, ceramic or silicon.

The material of the base includes organic epoxy type FR4, FR5, BT, PCB (print circuit board), alloy or metal. The alloy includes Alloy42 (42% Ni-58% Fe) or Kovar (29% Ni-17% Co-54% Fe). Alternatively, the base could be glass, ceramic or silicon.

DESCRIPTION OF THE PREFERRED EMBODIMENT

The following embodiments and drawings thereof are described and illustrated in the specification that are meant to be exemplary and illustrative, not limiting in scope. One skilled in the relevant art will identify that the invention may be practiced without one or more of the specific details, not limiting in scope.

Referenced throughout the specification to "one embodiment" or "an embodiment" means that a particular feature, structure, or characteristic described in connection with the embodiment and included in at least one embodiment of the present invention. Thus, the appearances of the phrase "in one embodiment" or "in an embodiment" in various places throughout the specification are not necessarily all referring to the same embodiment. Furthermore, the particular features, structures, or characteristics may be combined in any suitable manner in one or more embodiments.

The present invention discloses a structure of an image sensor module utilizing a substrate having predetermined cavity formed into the substrate. A photosensitive material is coated over the die and the base. Preferably, the material of the photosensitive material is formed of elastic material. The image sensor module comprising PCB mother board with cavity for Image Sensor chip and using solder paste to join with the wires between contact pads of Image sensor package and contact pads of PCB mother board. The module with super thin structure is less than 400 um. The image sensor chips can be processed by WLP to form the protection layer on micro lens and using the build up layers to form the RDL on the panel form substrate. The protection layer on micro lens may prevent the chip from particle contamination and it has water/oil repellent and the thickness of the layer is less than 0.5 um. The lens holder with IR cart can be fixed on the PCB mother board (on top the micro lens area). The high yield and high quality process can be achieved by the present invention.

Figure 1:
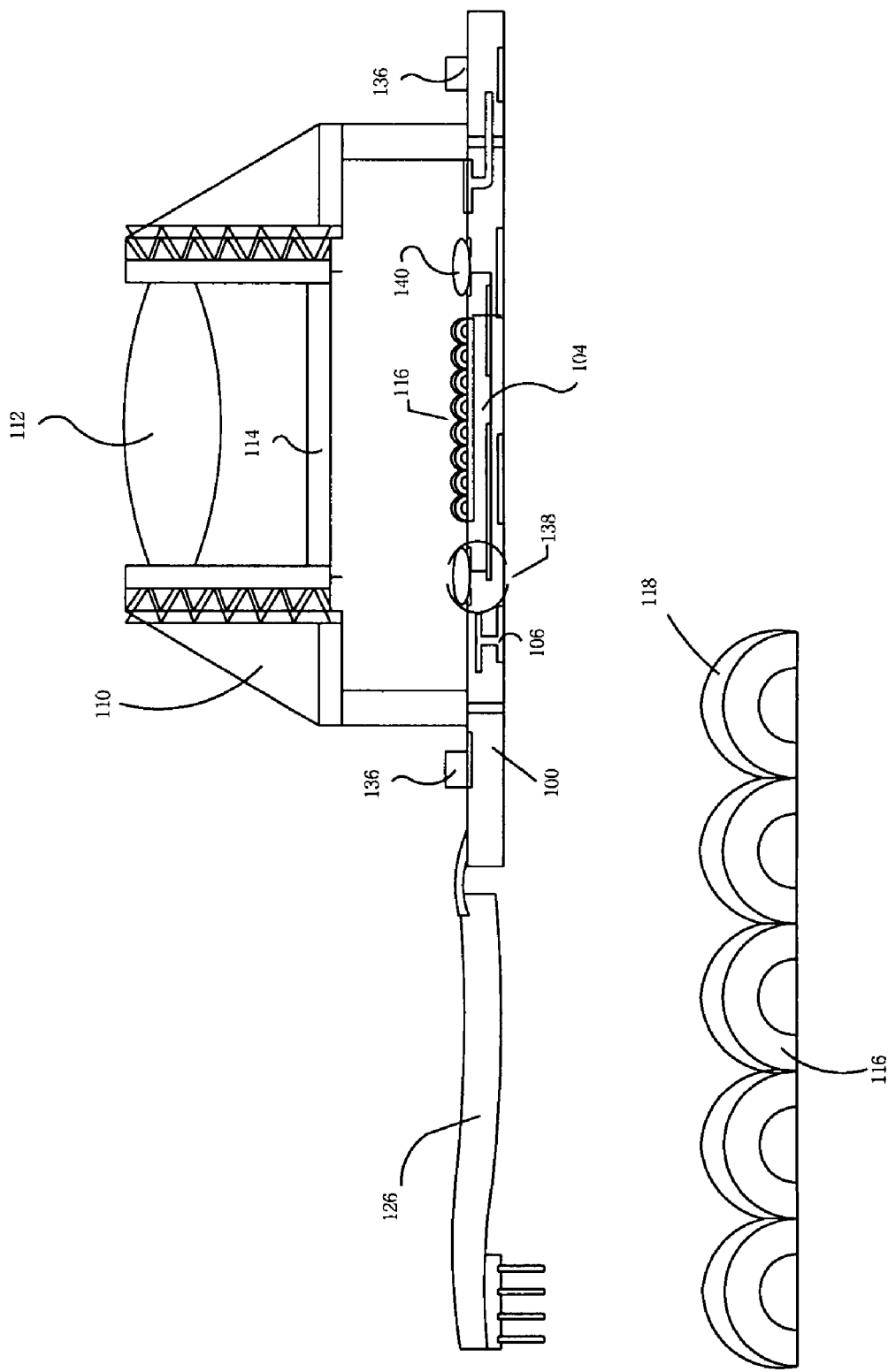
FIG. 1 depicts a cross-sectional view of a structure of image sensor module according to the present invention.

FIG. 1 depicts a cross-sectional view of the image sensor module in accordance with one embodiment of the present invention. As shown in the FIG. 2, the package structure formed within a substrate 100 includes a die 104 attached on a base 101 of the package, a first material 101a is filling into surrounding the die 104, and forming build up layers formed on the package. Pluralities of conductive traces 106 are created within the substrate 100 for electrical communication, and they connect a flexible circuit 126 for output, alternatively, solder bumps 140 are formed on the substrate 100 to output. A lens holder 110 is formed over the substrate 100 for supporting the lens and protection, additionally, holder guide pins with the through-hole formed on substrate 100. Lens 112 is attached on the upper portion of the lens holder 110. A filter 114 is located within the lens holder 110, between the lens 112 and the micro lens 116 formed on the die 104. The filter 114 can be omitted if it is combined with lens 112 together. The micro lens 116 includes a protection layer (film) 118 formed thereon. It should be noted that the passive device 136 may be formed on the substrate 100 and outside the lens holder 110.

Figure 2:
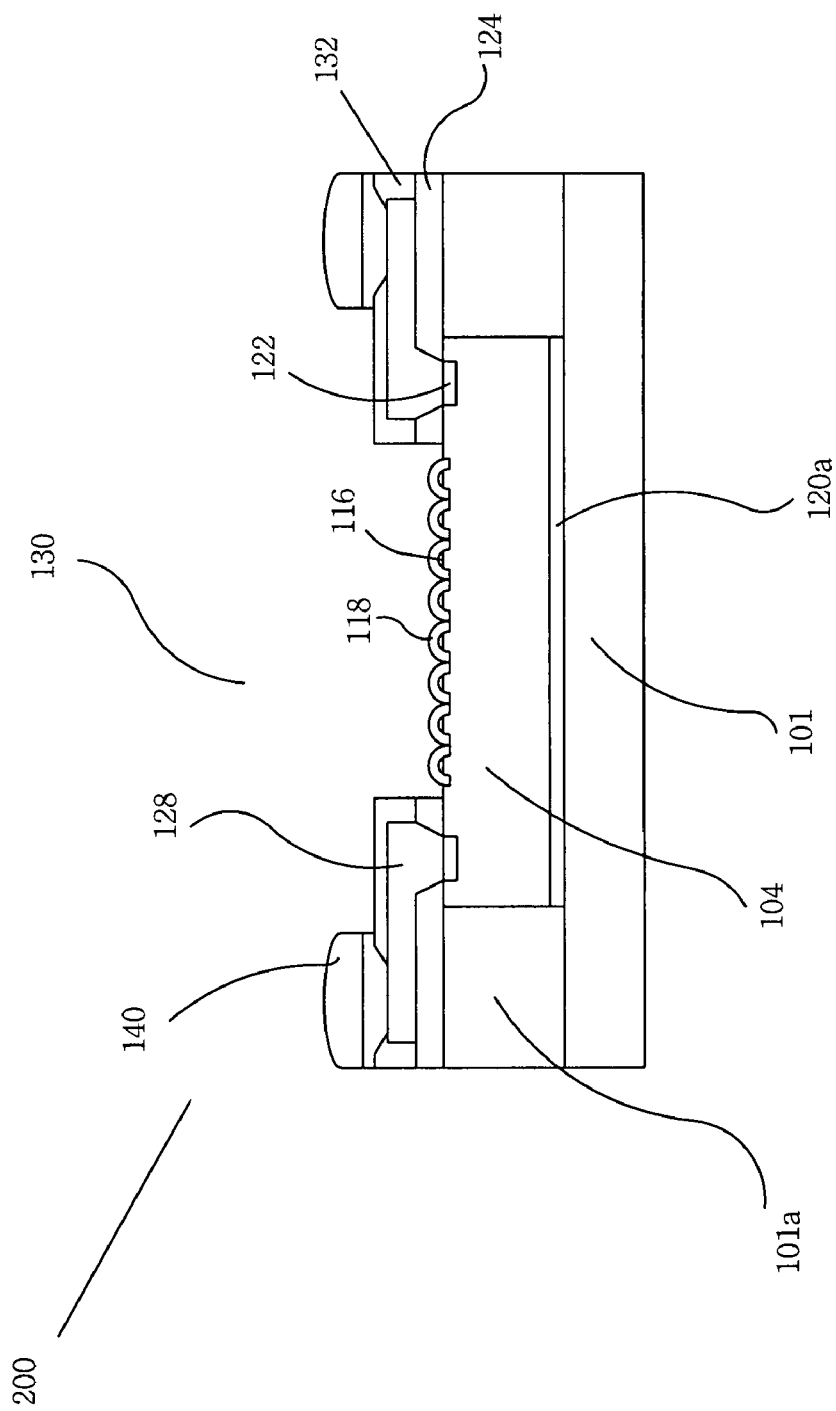
FIG. 2 depicts a partially detailed cross-sectional view of the structure of image sensor module according to the present invention.

FIG. 2 depicts the partially detailed cross-sectional view of the package structure of image sensor module shown in FIG. 1 in accordance with an embodiment of the present invention. The die 104 is attached on the base 101 of the package 200 and fixed by an adhesion (die attached) material 120a, and the first material 101a filling into the surround area of the die 104. As known, the contact pads (Bonding pads) 122 are formed on the die 104. A photosensitive layer or dielectric layer 124 is formed over the die 104 and the first material 101a. Pluralities of openings are formed within the dielectric layer 124 through the lithography process or exposure and development procedure. The pluralities of openings are aligned to the contact pads or I/O pads 122, respectively. The RDL (re-distribution layer) 128, also referred to as metal trace, is formed on the dielectric layer 124 by removing selected portions of metal layer formed over the layer, wherein the RDL 128 keeps electrically connecting with the die 104 through the I/O pads 122, electrically connecting solder bumps 140 with the RDL 128 and trace 106 to output. A part of the material of the RDL will re-fills into the openings in the dielectric layer 124, thereby forming contact via metal over the bonding pad 122. A protection layer 132 is formed to cover the RDL 128.

It should be noted that an opening 130 is formed within the dielectric layer (protection layer) 132 and the dielectric layer 124 to expose the micro lens 116 of the die 104 for CMOS Image Sensor (CIS). A protection layer 118 can be formed over the micro lens 116 on the micro lens area. The opening 130 is typically formed by photolithography process as well known to the skilled person in the art. In one case, the lower portion of the opening 130 can be opened during the formation of via opening. The upper portion of the opening 130 is formed after the deposition of the protection layer 132. Alternatively, the whole opening 130 is formed after the formation of the protection layer 132 by lithography. The image sensor chips has been coated the protection layer (film) 118 on the micro lens area; the protection layer (film) 118 with the properties of water repellent and oil repellent that can away the particle contamination on the micro lens area. The thickness of protection layer (film) 118 is preferably around 0.1 um to 0.3 um and the reflection index close to the air reflection index 1. The process can be executed by SOG (spin on glass) skill and it can be processed either in silicon wafer form or panel wafer form (preferably in silicon wafer form to avoid the particle contamination during further process). The materials of protection layer can be $SiO_2$, $Al_2O_3$ or Fluoro-polymer etc. Finally, a transparent cover 134 with coating IR filter is optionally formed over the micron lens 116 for protection. The transparent cover 114 is composed of glass, quartz, etc.

Figure 3:
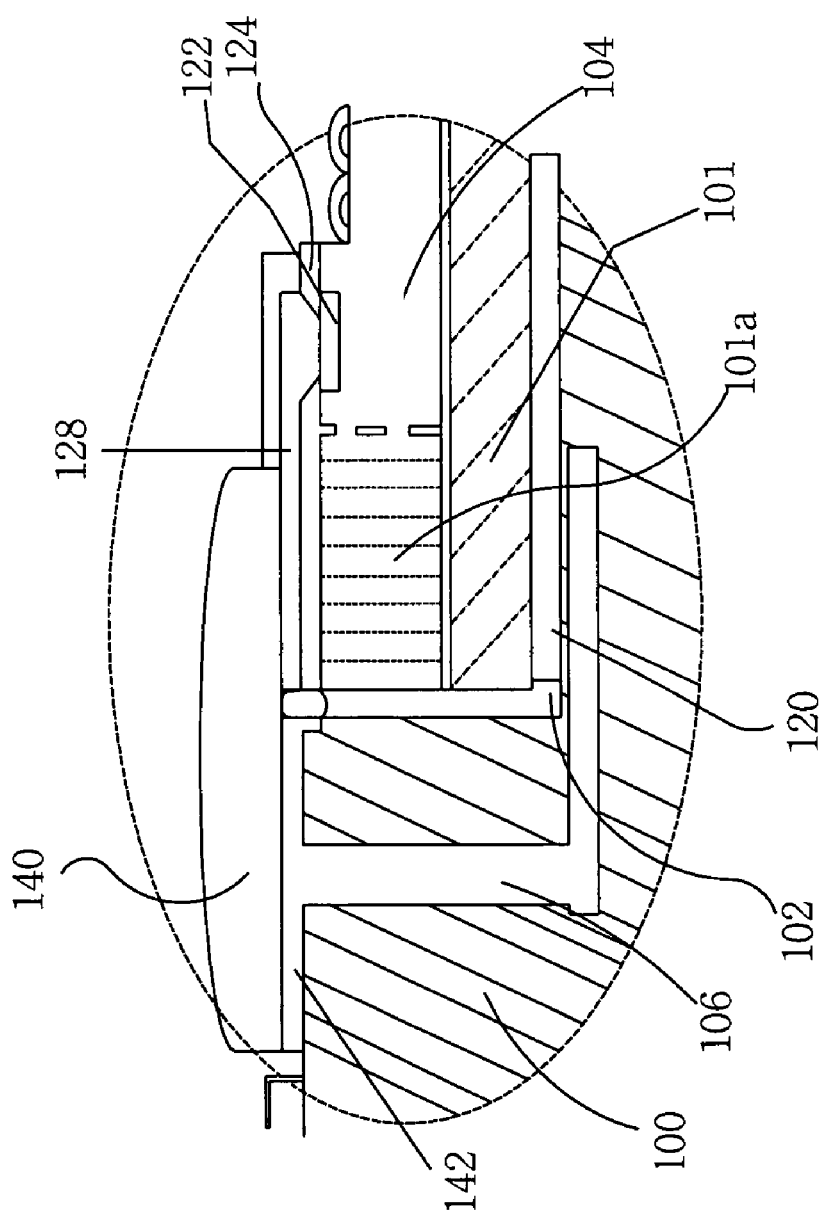
FIG. 3 depicts a partially detailed cross-sectional view of the cavity area structure shown in FIG. 2 according to the present invention.

FIG. 3 shows the partially detailed cross sectional view of the cavity area 138 during reflowing of solder bumps 140 in accordance with an embodiment. From the illustration, contact metal pads 142 are formed on the substrate 100 and contact metal pad on RDL 128 is formed on the die 104. The die 104 may communicate to the traces 106 within the PCB via the RDL 128 and the bonding pad 122. It is to form the same level between the RDL 128 and the contact metal pad 142 once the package 200 (die 104) is attached on the cavity 102, and then apply stencil printing solder paste that covers both RDL 128 and contact metal pad 142. The gap between the die 104 and cavity sidewall is about 100 um so that the solder paste can be joined together (bridge) to connect the contact metal pads 142 and the RDL during IR reflowing process.

Figure 4:
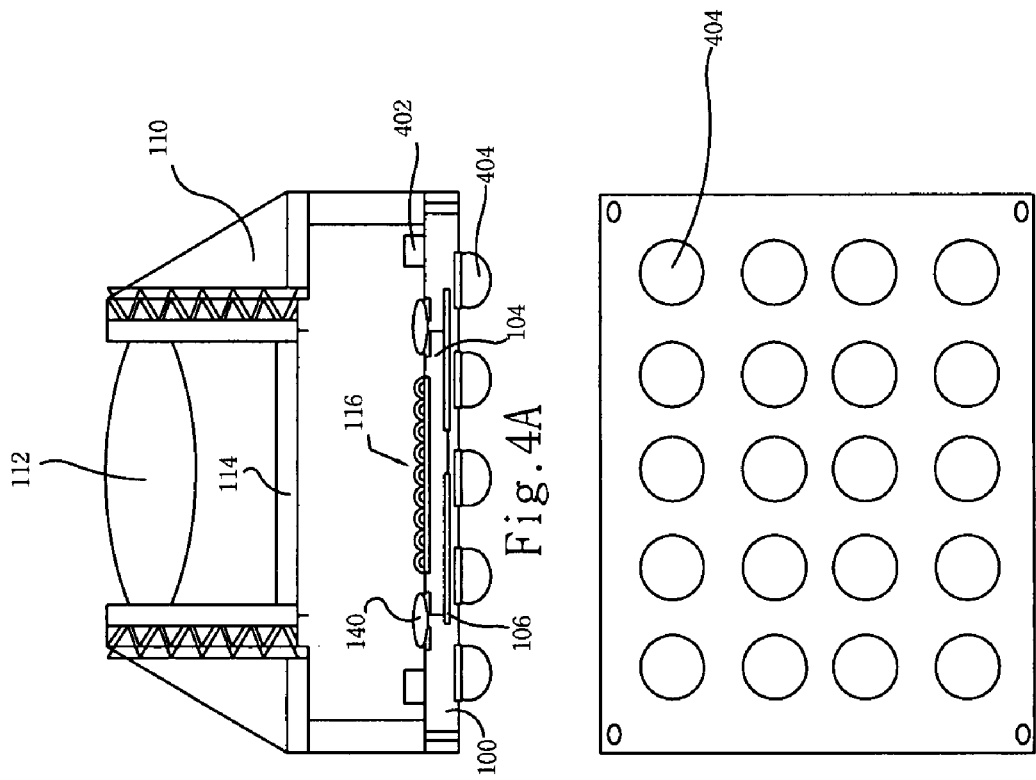
FIG. 4A depicts a cross-sectional view of a structure of image sensor module according to the present invention.
FIG. 4B depicts a bottom view of the structure of image sensor module shown in FIG. 4A according to the present invention.

An alternative embodiment can be seen in FIGS. 4A and 4B, most of the structures are similar to FIG. 1, therefore, the detailed description is omitted. Passive devices 402 may be formed within the lens holder 110 by SMT (surface mounting technology), and omitting flexible circuit 126 is omitted by solder balls 404 for fan out. This is to integrate the image sensor module and passive components in whole and to gain the number of output pin and minify the volume of image sensor module, alternatively, the solder bumps 140 also are used for outputting, therefore, the structure having two paths to output. The structure is for BGA (Ball Grid Array) type image sensor module.

Figure 5:
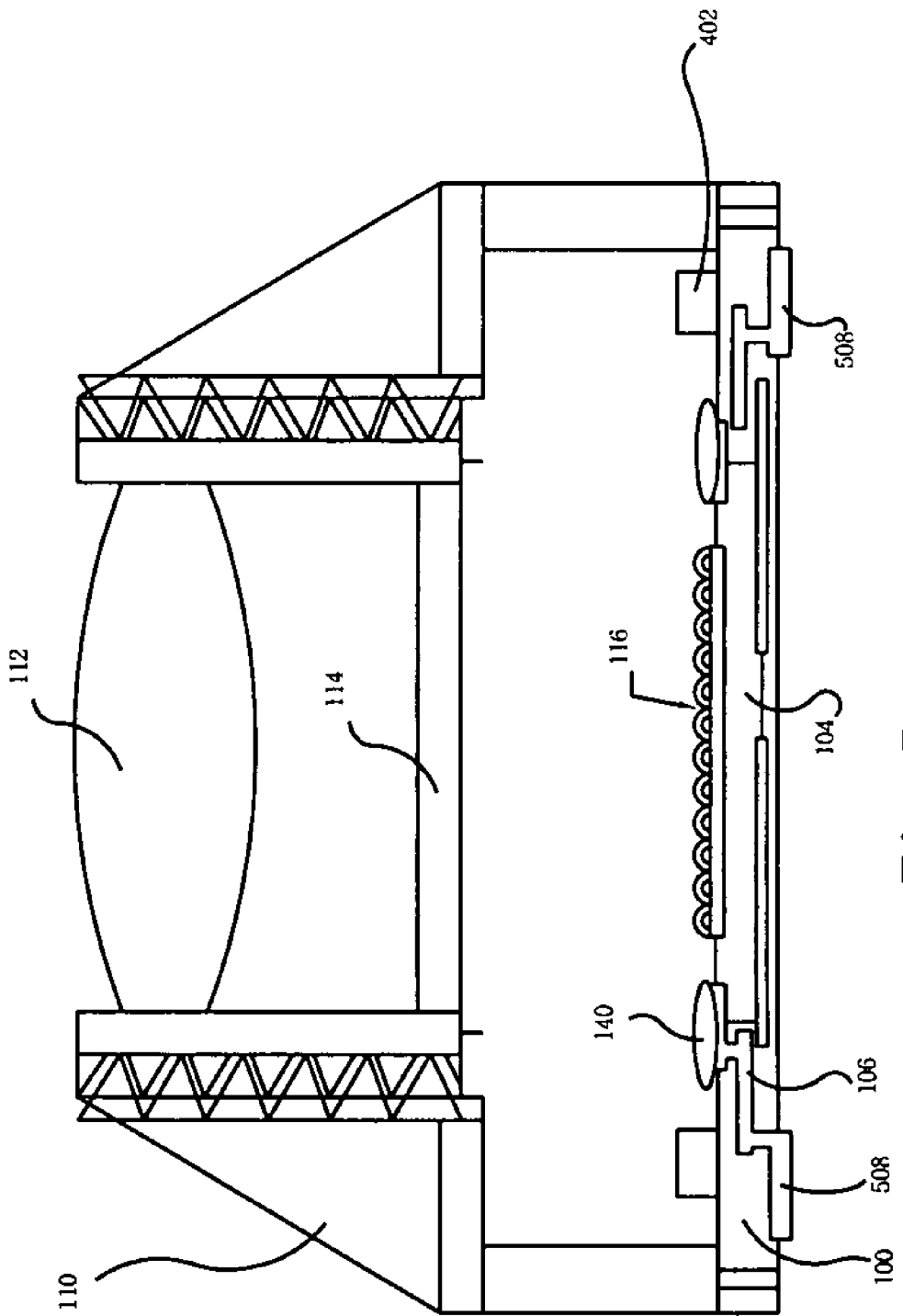
FIG. 5 depicts a cross-sectional view of a structure of image sensor module according to the present invention.

Alternately, FIG. 5 depicts a cross-sectional view of a structure of image sensor module according to the present invention. Pluralities of conductive traces 106 are created within the substrate 100 for electrical communication. Terminal Pads 508 are located on the bottom surface of the substrate 100 and connected with the traces 106 so that the image sensor module can be directly mount on the board. Alternatively, the solder bumps 140 also are used for outputting, therefore, the structure having two paths to output. The aforementioned structure constructs LGA type image sensor module.

Preferably, the material of the substrate 100 is organic substrate likes CCL, FR4, FR5, BT (Bismaleimide triazine), PCB with defined cavity or Alloy42 with pre etching circuit. The organic substrate with high Glass transition temperature (Tg) are epoxy type FR5 or BT (Bismaleimide triazine) type substrate. The Alloy42 is composed of 42% Ni and 58% Fe. Kovar can be used also, and it is composed of 29% Ni, 17% Co, 54% Fe. The glass, ceramic, silicon can be used as the substrate due to lower CTE. The dimension of the depth of the cavity 102 could be larger than the thickness of the die 104. It could be deeper as well.

The base 101 could be round type such as wafer type, the diameter could be 200, 300 mm or higher. It could be employed for rectangular type such as panel form. The substrate 100 is formed with cavities 102 and built in circuit 106.

In one embodiment of the present invention, the dielectric layer 124 is preferably an elastic dielectric material which is made by silicone dielectric materials comprising siloxane polymers (SINR), silicon oxide, silicon nitride, Dow Corning WL5000 series and composites thereof. In another embodiment, the dielectric layer is made by a material comprising benzocyclobutene (BCB), epoxy, polyimides (PI) or resin. Preferably, it is a photosensitive layer for simple process. In one embodiment of the present invention, the elastic dielectric layer is a kind of material with CTE larger than 100 (ppm/° C.), elongation rate about 40 percent (preferably 30 percent-50 percent), and the hardness of the material is between plastic and rubber. The thickness of the elastic dielectric layer 124 depends on the stress accumulated in the RDL/dielectric layer interface during temperature cycling test.

In one embodiment of the invention, the material of the RDL comprises Ti/Cu/Au alloy or Ti/Cu/Ni/Au alloy; the thickness of the RDL is between 2 um_and_15 um. The Ti/Cu alloy is formed by sputtering technique also as seed metal layers, and the Cu/Au or CU/Ni/Au alloy is formed by electroplating; exploiting the electro-plating process to form the RDL can make the RDL thick enough to withstand CTE mismatching during temperature cycling. The bonding pads 122 can be Al or Cu or combination thereof. In case of the structure of FO-WLP utilizes SINR as the elastic dielectric layer and Cu as the RDL metal. According to the stress analysis not shown here, the stress accumulated in the RDL/dielectric layer interface is reduced.

As shown in FIG. 2-5, the RDL metal fans out of the die 104 and communicates downwardly toward the terminal pads 508 or solder balls 404 under the structure, alternatively, to communicate upwardly toward the solder bumps 140 over the structure. It is different from the prior art technology which stacks layers over the die, thereby increasing the thickness of the package. However, it violates the rule to reduce the die package thickness. On the contrary, the terminal pads are located on the surface that is opposite to the die pads side. The communication traces 106 are penetrates through the substrate 100. Therefore, the thickness of the die package is apparently shrinkage. The package of the present invention will be thinner than the prior art. Further, the substrate is pre-prepared before package. The cavity 102 and the traces 106 are pre-determined as well. Thus, the throughput will be improved than ever.

The method of present invention comprises: providing the PCB (FR5/BT) with CIS package cavity. Then, the next step is to pick the CIS package (from blue tape flame) and attach the CIS package into the cavity. Then, the attached material is cured. Build up layers (RDL) process is performed to form the RDL in the package (pre-formed). Then, the stencil printing solder paste on substrate (cover both contact pads), subsequently, and pick and place the passive components on the PCB by picking and placing tool. Afterward, IR reflow is used to solder joining with contact pads of the image sensor module and contact pads of PCB, passive components, and the solder bumps formed on upper surface of the substrate with the trace, followed by flux cleaning the PCB. Next is to mount the lens holder and fix the holder on the PCB, followed by module testing.

The advantages of the present invention are:

Module is linking with MB (mother board) without "connector" for BGA/LGA type

SMT process is used to mount CIS module on MB for BGA/LGA type

Build up layers process is used for CIS package

PCB with cavities for super thin module

Small foot print (form factor)

Simple process for CIS module

Solder join terminal pins are standard format (for LGA/BGA type)

Module re-workable by de-soldering from MB

Highest yield during manufacturing in module/system assembly

Protection layer is on the micro lens to prevent particle contamination

Lowest cost substrate (PCB-FR4 or FR5/BT type)

High yield due to build up layers process

Although preferred embodiments of the present invention have been described, it will be understood by those skilled in the art that the present invention should not be limited to the described preferred embodiments. Rather, various changes and modifications can be made within the spirit and scope of the present invention, as defined by the following Claims.

What is claimed is:

1. An image sensor module structure, comprising:
  a substrate with a package-receiving cavity formed in an upper surface of said substrate and conductive traces formed within said substrate, wherein said substrate includes a contact metal formed thereon;
  a package having an opening to expose a micro-lens area and a fan-out build up layer with terminal metal pads formed on a side edge of said package, said package being disposed within said package-receiving cavity;
  a solder bridge formed on said terminal metal pads of said package and said substrate to communicate with said conductive trace through said contact metal;
  a lens holder attached on said substrate, said lens holder having a lens attached to an upper portion of said lens holder; and wherein said package includes:
  a base;
  a die having said micro-lens area attached to said base;
  a first material surrounding said die, wherein said surface of said first material is formed level with said die surface;
  a dielectric layer formed on said die and said the first material, wherein said dielectric layer has an opening to expose said micro-lens and I/O pads;
  a redistribution conductive layer (RDL) formed on said dielectric layer, wherein said RDL is coupled to said die and said terminal contact pads; and
  a protective dielectric layer formed over said RDL, and having an opening to expose said micro-lens and terminal contact pads.

2. The structure of claim 1, further comprising a terminal contact formed at said lower surface of said substrate for communicating electrical signals.

3. The structure of claim 1, further comprising a solder ball formed at said lower surface of said substrate for fan out.

4. The structure of claim 1, further comprising a passive device on said upper surface of said substrate within said lens holder.

5. The structure of claim 1, further comprising an IR filter attached between said lens and said micro-lens.

6. The structure of claim 1, wherein said dielectric layer includes an elastic dielectric layer.

7. The structure of claim 1, wherein said dielectric layer comprises a silicone dielectric-based material, BCB or PI.

8. The structure of claim 7, wherein said silicone dielectric-based material comprises siloxane polymers (SINR) or Dow Corning WL5000 series.

9. The structure of claim 1, wherein said dielectric layer comprises a photosensitive layer.

10. The structure of claim 1, wherein said RDL is made from an alloy comprising Ti/Cu/Au alloy or Ti/Cu/Ni/Au alloy.

11. The structure of claim 1, wherein the material of said base includes epoxy type FR5, FR4, BT, PCB (printed circuit board), glass, ceramic, silicon, alloy or metal.

12. The structure of claim 1, wherein the material of said substrate includes PCB.

13. The structure of claim 1, further comprising a protective layer formed on said the micro-lens to prevent particle contamination.

14. The structure of claim 13, the materials of said protective layer includes SiO2, Al2O3 or fluoro-polymer.

15. The structure of claim 13, wherein said protective layer includes water repellent and oil repellent properties.

* * * * *